(12) United States Patent
Huber

(10) Patent No.: US 7,778,353 B2
(45) Date of Patent: Aug. 17, 2010

(54) CONTROLLER FOR A RADIO-FREQUENCY AMPLIFIER

(75) Inventor: Klaus Huber, Effeltrich (DE)

(73) Assignee: Siemens Aktiengesellschaft, Munich (DE)

( * ) Notice: Subject to any disclaimer, the term of this patent is extended or adjusted under 35 U.S.C. 154(b) by 607 days.

(21) Appl. No.: 11/744,274

(22) Filed: May 4, 2007

(65) Prior Publication Data
US 2007/0258543 A1 Nov. 8, 2007

(30) Foreign Application Priority Data
May 4, 2006 (DE) .................... 10 2006 020 831

(51) Int. Cl.
 H04K 1/02 (2006.01)
 H04L 25/03 (2006.01)
 H04L 25/49 (2006.01)
(52) U.S. Cl. ...................... 375/297; 375/296
(58) Field of Classification Search ............ 375/296, 375/297
See application file for complete search history.

(56) References Cited

U.S. PATENT DOCUMENTS

| | | | |
|---|---|---|---|
| 6,246,286 B1 | 6/2001 | Persson | |
| 6,714,093 B2 | 3/2004 | Oppelt et al. | |
| 6,876,197 B2 | 4/2005 | Albrecht et al. | |
| 6,947,711 B1 * | 9/2005 | Leyonhjelm | 455/114.3 |
| 7,123,890 B2 | 10/2006 | Kenington et al. | |
| 2003/0117215 A1 * | 6/2003 | O'Flaherty et al. | 330/149 |
| 2007/0093218 A1 | 4/2007 | Nagel | |

OTHER PUBLICATIONS

"Halbleiter-Schaltungstechnik," Tietze et al (1993) pp. 331-348 and 951-952.

\* cited by examiner

*Primary Examiner*—Curtis B Odom
(74) *Attorney, Agent, or Firm*—Schiff Hardin LLP

(57) ABSTRACT

A controller for an RF amplifier, in particular for an RF amplifier of an MR tomograph, contains an RF control element that finely adjusts an RF signal requiring to be fed to the RF amplifier in magnitude and phase using LF control parameters of a control element regulator, a power meter that measures the input power of the RF signal fed to the RF amplifier and a pre-emphasizer that applies correction values dependent on the input power to the LF control parameters to compensate a power-dependent characteristic curve of the RF amplifier.

1 Claim, 6 Drawing Sheets

(a)

(b)

(a)

(b)

CONTROLLER FOR A RADIO-FREQUENCY AMPLIFIER

BACKGROUND OF THE INVENTION

1. Field of the Invention

The present invention concerns a controller for a radio-frequency amplifier.

2. Description of the Prior Art

A radio-frequency amplifier (RF amplifier) serves to amplify, with as little as distortion as possible a radio-frequency signal (RF signal) fed to the amplifier in order to obtain an RF signal of greater power at its output. RF signals having pulse powers of 15 to 30 kW are necessary particularly for special medical examinations by means of a magnetic resonance tomography (MRT), using an MRT apparatus. RF amplifiers are therefore employed in such apparatuses for producing RF signals having power in the aforementioned range. The RF signals are pulsed, meaning they need this power for a period ranging from a few μs to a few ms. Very precise pulse powers thus are necessary at the RF amplifier's output, especially in the case of functional MRI (magnetic resonance imaging), in order to produce high-quality medical images using the MRT apparatus. Pulse-repetition accuracies of the amplified RF signal in the order of approximately 1-4% can be achieved using a conventional transmission arrangement. The term "precise" in this context means that both the amplitude and phase of the RF signal have to meet exact specifications. To obtain accuracies of this order for the RF amplifier's RF output signal, the amplifier is provided with regulating means.

A transmission arrangement for a magnetic resonance apparatus is known from DE 103 35 144 B3 that contains control means for the amplitude and phase of the RF amplifier's RF output signal. The ratio between the RF amplifier's input and output power, which is to say of the RF signal to be amplified to the amplified RF signal (what is termed the actual amplification or actual gain), is determined by suitable detectors. The phase relationship between these two signals is also determined (termed the actual phase difference). For example an integrated gain and phase detector, for instance an AD8302 chip from the company Analog Devices, is used for that purpose. A settable attenuator and settable phase control element are used in two separate control loops for keeping the RF output signal's output amplitude and output phase constant or at the desired ratio to the RF input signal, i.e., for setting a desired amplification (desired gain) or desired phase difference.

FIG. 5 shows such an arrangement according to the prior art. A controller means 202 is connected upstream of an amplifier 200, also called an RFPA (Radio Frequency Power Amplifier). An RF input signal 206 is fed into the arrangement at an input 204. This signal proceeds through the controller means 202 and amplifier 200 via the signal line 208, to exit the arrangement as an amplified RF output signal 212 at the output 210. The controller means 202 has both a gain detector 214 and a phase detector 216.

Two measured variables, for both the RF input signal 206 and the RF output signal 212, are fed via respective signal couplers 218 and 220 assigned to the input 204 and output 210, and via corresponding measuring leads 222 and 224, both to the gain detector 214 and to the phase detector 216. The gain detector 214 determines the actual amplitude amplification 226 (actual gain) and the phase detector 216 determines the actual phase difference 228 between the RF output signal 212 and RF input signal 206. High-frequency signals (RF signals) in the range around 63 or 123 MHz, for example, are present on the measuring lines 222, 224.

The actual amplitude amplification 226 and actual phase difference 228, by contrast, as output signals of the gain detector 214 and phase detector 216, are low-frequency signals (LF signals). The actual amplitude amplification 222 and actual phase difference 228 are compared in comparators 230, 232 with a desired amplification 234 and desired phase difference 236 and appropriate correction signals are conveyed via control amplifiers 238, 240 to an attenuator 242 and a phase control element 244 in the signal line 208.

The signal paths all run separately from each other, so both the attenuator 242 and phase control element 244 are consequently provided with mutually independent, separate control loops 246, 248. An integrated gain and phase detector as mentioned above alternatively can combine the two discrete gain detector 214 and phase detector 216 components in the form of an IC 250, indicated in FIG. 5 by dashed outlining.

The RF amplifier 200, when used as an RF (radio-frequency) power amplifier in an MR system has a sharply expanding characteristic curve indicated in FIG. 5 by the characteristic curve 252. Sharply expanding means that the amplification for small input signals 206, which is to say for signals of the type having small amplitudes or, as the case may be, signal powers, is far less than for large or, as the case may be, powerful input signals 206. For different input powers Pin of the signal 206, graph (a) in FIG. 6 shows the relative amplification G of the RF amplifier 200 at a frequency of 63.6 MHz as the characteristic curve 260. Plotted above the same abscissa, graph (b) in FIG. 6 shows the amplitude error, produced by the RF amplifier 200, of the RF output signal 212 compared with the RF input signal 206 as the characteristic curve 262.

As mentioned above, MR systems operate in pulsed mode, to the characteristic curves 260, 262 shown in graphs (a) and (b) in FIG. 6 are at least partially traversed several times during each recording sequence, meaning during repeated triggering of relevant signal pulses of the RF input signal 206. In addition to variations in the amplification characteristics of the arrangement shown in FIG. 5 due to, for instance, temperature drifting etc., the regulating circuit 202 must therefore always also compensate the non-linear characteristic curves 260, 262. Due to the expanding nature of the characteristic curves 260, 262 there is also a risk that, because of the necessary large amplitude amplifications of the amplitude control element 242 at the start of a pulse, meaning in the case of low levels or powers of the RF input signal 206, the amplification may not be regulated fast enough, which will lead to overshoots and, in the worst case, safety shut-down of the amplifier 200.

It is known from the aforementioned DE 103 35 144 B3 to compensate the expanding characteristic curves 260, 262 by means of a compression network of diodes and resistors. The sharply expanding characteristic of the amplifier 200, however, can be only partially corrected by networks of this type. Such circuits, moreover, are sensitive to thermal influences and are unable to compensate phase deviations.

An analog dynamic compressor is known from DE 101 48 441 C1 by means of which far greater compression can be achieved with better temperature stability than by means of the simple diode/resistor network known from DE 103 35 144 B3. It is, however, difficult in practice to simultaneously compensate the amplitude characteristic 260 and phase characteristic 262 of the amplifier 200 using this compressor. Furthermore, both the power and circuitry requirements of an analog compressor circuit of such a type are very high for typical MR frequencies in the 63.6 or 123.2 MHz RF range.

FIG. 7 is a block diagram of the cited dynamic compressor 300. The regulating circuit 202 shown in FIG. 5 has been replaced in FIG. 7 by an alternative embodiment, using an IQ control element 302 with the pre-amplifier 304. The IQ control element 302 performs the same function as the attenuator 242 and phase control element 244 shown in FIG. 5, namely harmonizing the RF input signal 206 in terms of magnitude and phase for supplying the RF in-put signal 206, modified in that way at the input 306, to the dynamic compressor 300. Pre-emphasizing by the dynamic compressor 300 for compensating the characteristic curves 260, 262 thus takes place in the radio-frequency or, as the case may be, RF path in the arrangement shown in FIG. 5.

The RF signal 206 requiring to be amplified is fed to the IQ control element and split into two partial signals having a 9020 phase offset. The partial signals then each traverse an I and a Q path. The corresponding partial signal is weighted in the I path with an I factor and in the Q path with a Q factor. The partial signals are recombined via a summing unit and the sum signal is supplied to the RF amplifier 200 (via the dynamic compressor 300). The IQ control element also influences the magnitude and phase of the RF signal 206 requiring to be fed to the RF amplifier. However, multiplying the partial signals by the I and Q factor therein in each case influences only the amplitude of the partial signals and not their phase. Because the partial signals correspond, due to the 90° phase offset, to a real and imaginary component of a complex phasor (namely their sum), the addition of the real and imaginary component, namely in the form of the IQ controller's output signal fed to the amplifier, produces a change in the respective amplitudes of the partial signals that allow total signal to be manipulated (modified) in its amplitude or phase.

Until fed into the multipliers, the I and Q factors therein operate on an LF basis in contrast to the signal paths of the partial signals in the I and Q path forming RF paths.

Because the multipliers in the IQ controller can be embodied in analog form, an IQ control element of the described type is readily able to provide the required rise times of far below 1 µs. For driving the IQ element, however, it will then be necessary to convert the intended phase and amplification changes, meaning the changes in amplitude in the RF signal (desired and actual values), into respective I and Q factors in keeping with the amplification factors for the real and imaginary component (partial signals in the partial paths). That can be done using corresponding A/D conversion and by means of digital calculations performed by a digital computer, or in an analogous way, as is described in an application of the same assignee (Siemens AG) as the present application filed simultaneously herewith and having Ser. No. 11/744,291.

SUMMARY OF THE INVENTION

An object of the present invention is to provide an improved arrangement for pre-emphasis of the input signal to an RF amplifier, in particular for an RF amplifier of an MR tomography apparatus.

The above object also is achieved in accordance with the invention by a controller that conducts pre-emphasizing in the manner described above.

The invention is based on the insight that pre-emphasizing is removed from the RF path and is performed by means of pre-emphasizing in the low-frequency path in the arrangement shown in FIG. 5 or FIG. 7. Pre-emphasizing is therefore integrated in the inventive controller, which therefore also performs pre-emphasizing for the RF amplifier's non-linear characteristic curve alongside actual controlling of the RF signal requiring to be amplified.

As described above, RF amplifiers of the type considered herein have an RF control element (for example an amplitude- and phase-control element or IQ control element) for matching the amplitude and phase in the RF path, which is driven by LF control parameters (amplitude- and phase-setting signal or I and Q factor). Pre-emphasizing is then inventively implemented by appropriately setting the LF control parameters to perform desired pre-emphasizing in the RF path. In other words, pre-emphasizing is superimposed on previous amplitude and phase controlling or, in terms of the LF control parameters, added thereto. Amplitude and phase matching as well as pre-emphasizing are in reality combined in that way in the LF path.

Pre-emphasizing or, as the case may be, determining of the parameters thereof is therefore performed by a pre-emphasizer in the LF path, with only its "implementing organ" that actually manipulates the RF signal being located in the RF path. Proceeding from the non-linear characteristic curves 260, 262 for the RF amplifier's amplification and phase difference, it is therefore possible to determine suitable characteristic curves for the pre-emphasizer. The momentary value of the RF signal's input power being determined, the RF signal's input level for the RF amplifier will be known at any time. In the pre-emphasizer an appropriate correction value can thus always be passed to the IQ control element based on the characteristic curve.

The correction values for driving the RF control element can be determined according to the momentary signal power.

As noted, the RF control element can be a cascade known, for example, according to FIG. 5 comprising an amplitude-control and phase-control elements. The pre-emphasizer then supplies additive values for the amplitude- and phase-setting value with which the control element is supplied from the relevant drive. An inventive control unit can in that way be simply integrated into a known conventional controller for an RF amplifier.

The RF control element alternatively can be an IQ control element. The pre-emphasizer will then be assigned to the IQ controller for producing the I and Q factor and will additively superimpose the correction values for pre-emphasizing onto the I and Q factor.

For that purpose the I and Q path are in a known IQ controller each provided with a pre-emphasizer that influences the IQ control element's I and Q factor in each case with a correction value dependent on the power.

The pre-emphasizer can be a digital pre-emphasizer. The in-verse characteristic curve of the RF amplifier's non-linearity will in that case be particularly easy to store in the form of, for example, a look-up table.

The pre-emphasizer can, though, also be an analog pre-emphasizer. Being as a rule faster than a digital pre-emphasizer, it can help to implement faster signal rise times in the overall amplifier arrangement.

An analog pre-emphasizer can accordingly contain a function network. With a function network, each characteristic curve, for example 60, 62, is approximated, which is to say the curve of the correction value is in that case approximated for compensating the characteristic curve above the RF signal's input power by means of a polygonal line. It has in practice been shown that a relatively coarse approximation from, for example, three linear sections will generally suffice for a corresponding polygonal line for achieving adequate pre-emphasizing. Implementation of such function networks is known from, for example, Titze/Schenk, "Halbleiterschaltungstechnik" Semiconductor Circuit Technology), 10th edition, published by Springer-Verlag in 1993.

When there are separate control loops in the controller as-signed to the RF control element, for example for the amplitude and phase or I and Q path, each control loop can be as-signed a separate pre-emphasizer. The system will then be decoupled and be easy to control.

If an IQ controller is employed as the controller, the IQ controller can have an operating point which at said point has I and Q factors of equal magnitude, or the IQ controller can be an analog controller. For a more detailed explanation, reference is made to the above-cited simultaneously-fifed patent application.

DESCRIPTION OF THE PREFERRED EMBODIMENTS

Figure 1:
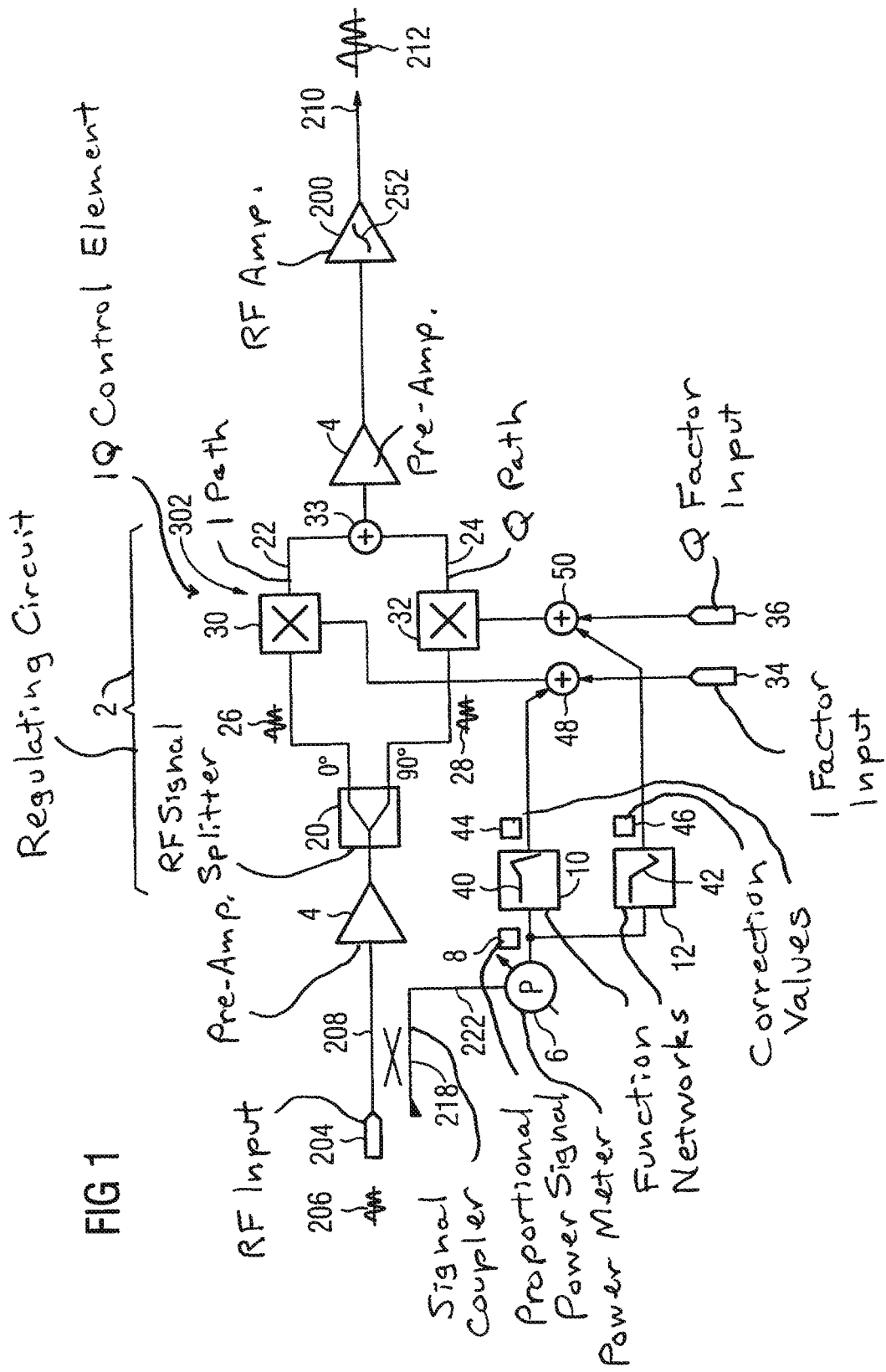
FIG. 1 shows an amplifier arrangement having an inventive controller for simultaneously pre-emphasizing the RF signal.

FIG. 1 shows an inventive regulating circuit 2 having an IQ control element 302. Connected upstream of the IQ control element 302 in the RF signal lead 208 is a pre-amplifier 4. The RF input signal 206 from RF input 204 is split via an RF signal splitter 20 onto an I path 22 and a Q path 24 in the IQ control element 302. The RF partial signal 26 in the I path 22 has a 90° phase offset relative to the RF partial signal 28 in the Q path 24. The I and Q path 22 and 24 each have an RF multiplier 30, 32 by which the respective partial signal 26, 28 is multiplied by an I factor 34 and Q factor 36. The correspondingly weighted RF signals are recombined by means of an RF summing unit 33 and fed via a further RF pre-amplifier 4 to the RF amplifier 200. A measuring signal decoupled on the RF signal lead 208 via a signal coupler 218 is fed via a lead 222 to a power meter 6. The power meter 6 measures the intrinsic power of the RF input signal 206.

The signal 8 of proportional power is already a signal in the LF range and is fed to two function networks 10, 12, which determine respective correction values 44, 46 for the I factor 34 and Q factor 36 via corresponding characteristic curves 40, 42. The correction values 44, 46 are added in adders 48, 50 to the I factor 34 and Q factor 36 and fed to the multipliers 30, 32. Determining of the I and Q factor in an IQ controller (not shown) is not explained further here.

The entire signal path between the power meter 6 and multipliers 30 and 32 is thus in the low-frequency range.

Figure 2:
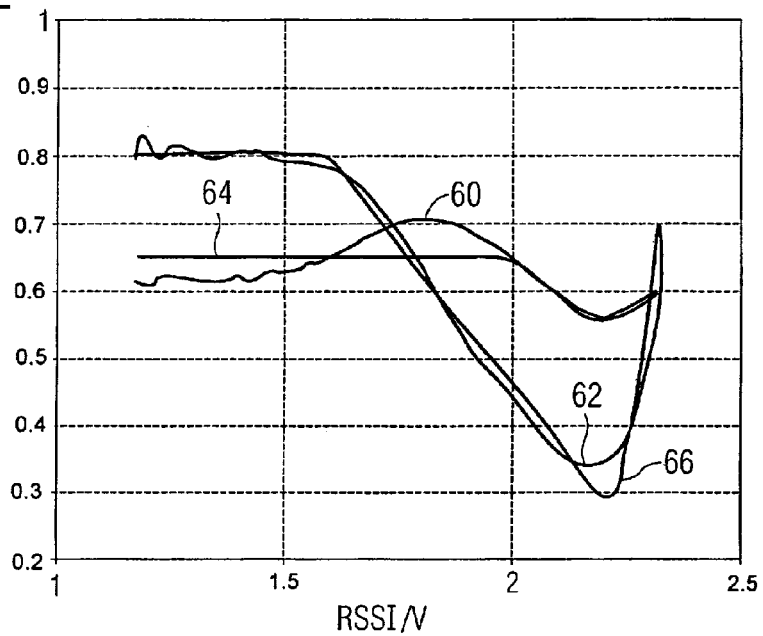
FIG. 2 shows the ideal correction curves and curves that are linearly approximated section-by-section for the non-linear amplifier characteristic of the RF amplifier shown in FIG. 1.
Figure 6:
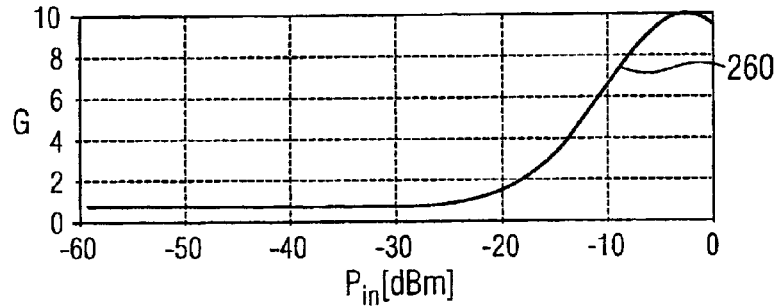
FIG. 6 shows the transfer characteristics of the RF amplifier shown in FIG. 1 and FIG. 5 for (a) magnitude and (b) phase according to the prior art.
Figure 6:
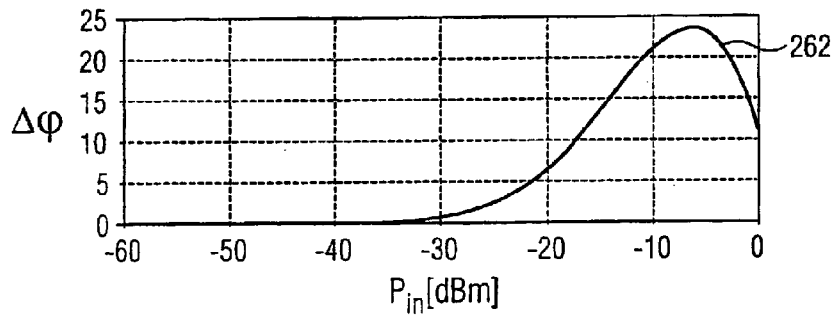
Figure 7:
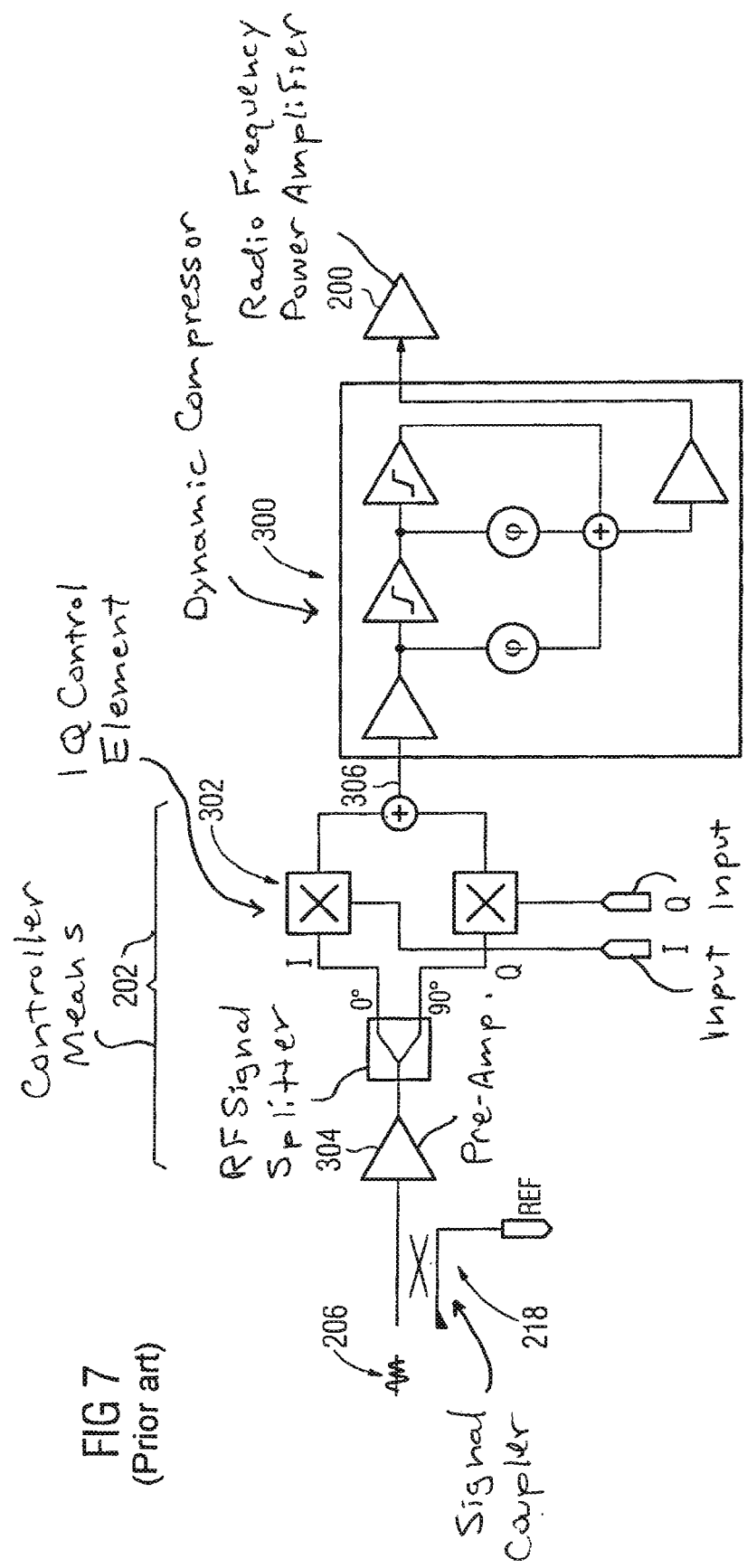
FIG. 7 shows a conventional regulating circuit for an RF amplifier according to FIG. 5, but having an IQ control element and a pre-emphasizer in the RF path according to the prior art.

FIG. 2 shows the pre-emphasizer characteristics for the non-linear amplifier characteristics 260, 262 shown in graphs (a) and (b) in FIG. 6 plotted in volts above the RSSI voltage that is proportional to the logarithm of the input power of the RF input signal 206 and measured by a logarithmic detector (not shown) in accordance with the power meter 6 such as, for example, the AD 8310 from the company Analog Devices. Plotted are the respective control-element voltages for the multipliers 30 and 32 in the I path 22 and Q path 24. The curves 60 and 62 are the ideal correction curves for the curves from 260, 262, which is to say from the non-linear characteristic curves of the RF amplifier 200, as ideal control voltages for the IQ control element 302 for compensating said latter curves. The curves 64 and 66 are the polygonal lines approximated to the curves 60 and 62 by the function networks 40 and 42. Said curves 60 and 62 have been determined with the aid of a least square fit algorithm.

For explanation, FIG. 4A again shows the amplifier 200 to which an input power $P_e$ is fed and which amplifies the power up to an output power $P_a$. FIG. 4B shows the output power Pa as a function of the input power Pe, specifically in terms only of the amplification, namely the gain. The ideal output power is shown by means of the dashed curve 72 as $P_a = G_o P_e$. The curve 74 shows the real output power $P_a = G_v(P_e) P_e$.

Figure 4A:
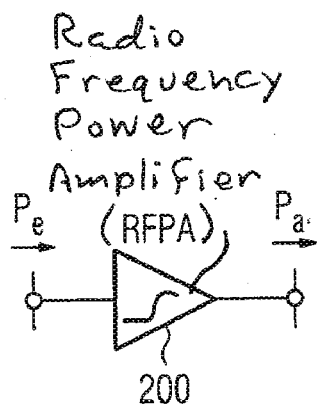
FIG. 4A schematically illustrates a radio-frequency amplifier controlled according to the present invention, indicating the input and output thereof.
Figure 4B:
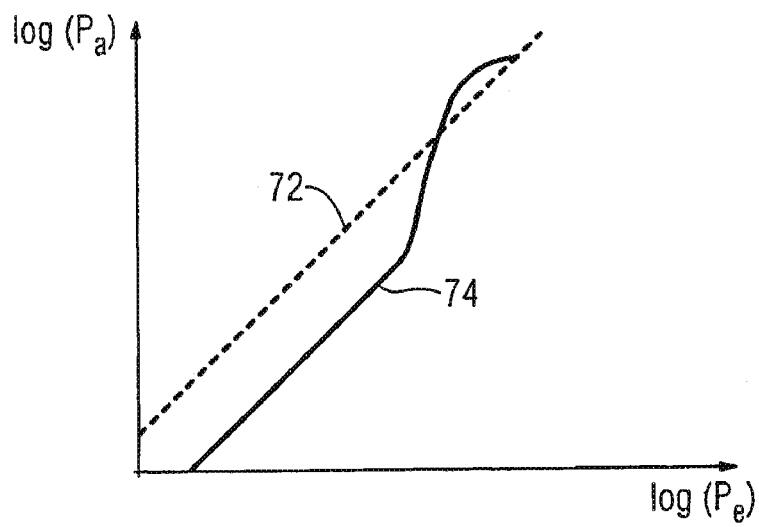
FIG. 4B is graph showing the output power as a function of the input power of the amplifier shown in FIG. 4A.
Figure 4C:
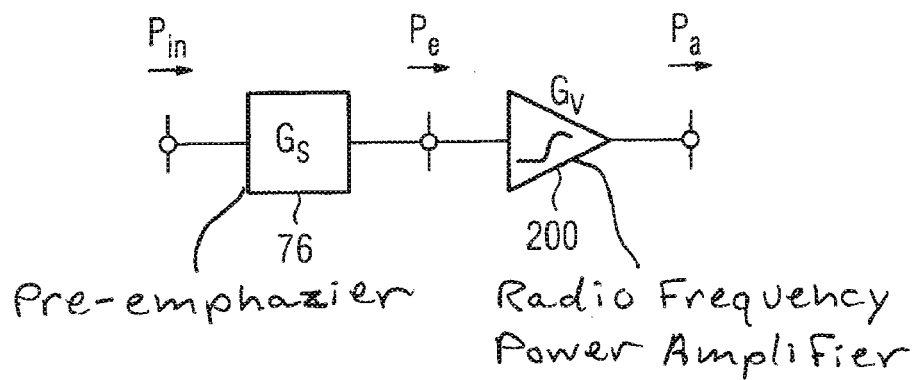
FIG. 4C shows the amplifier of FIG. 4A, with a preceding pre-emphasizer in accordance with the present invention.
Figure 5:
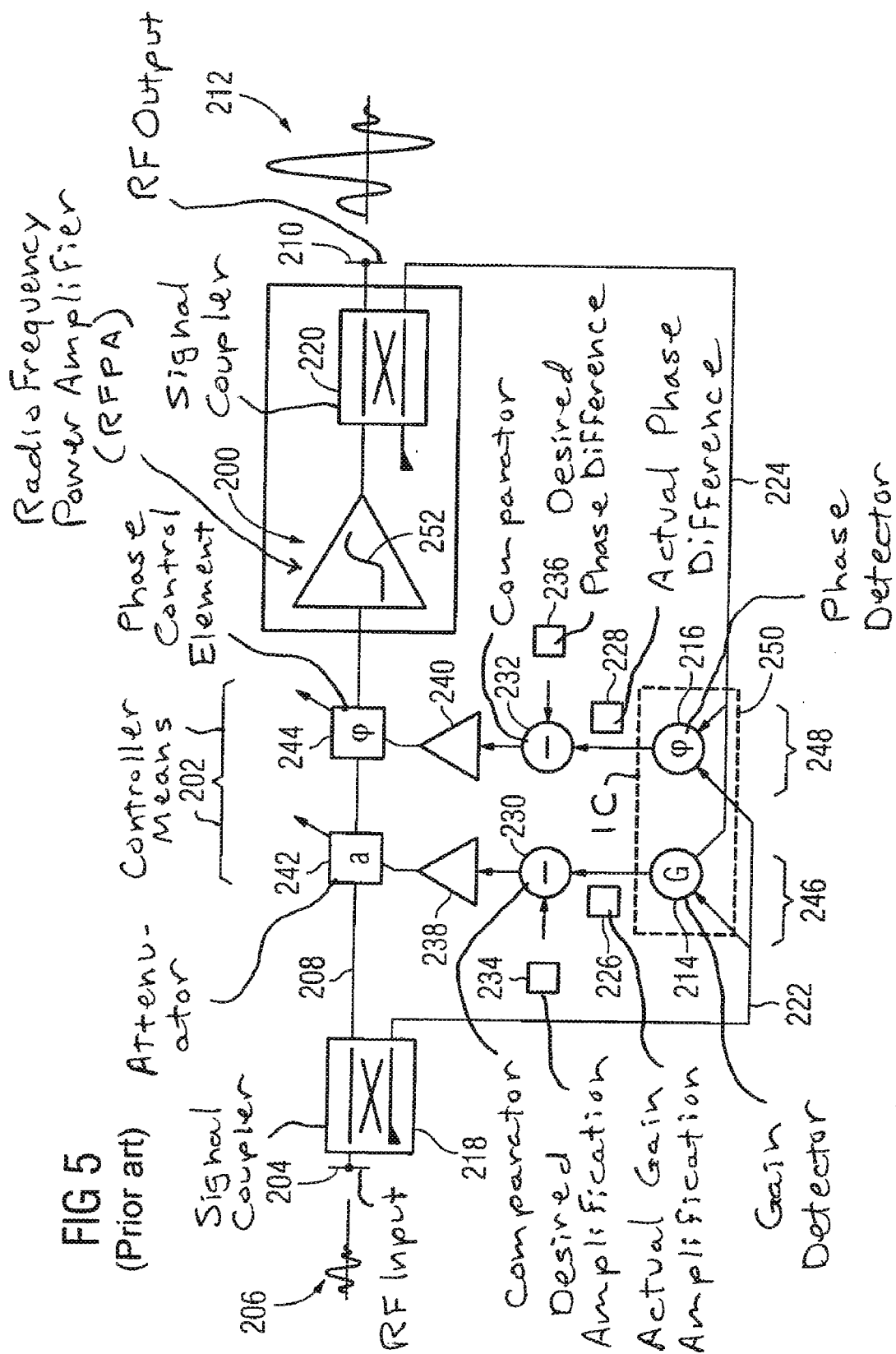
FIG. 5 shows a conventional regulating circuit for an RF amplifier for amplitude and phase matching having cascaded amplitude-control and phase-control elements according to the prior art.

FIG. 4C shows the amplifier 200 according to FIG. 4A, but having the inventive pre-emphasizer 76, which is supplied with the power Pin from which via its characteristic curve $G_s$ it selectively produces the power $P_e$ fed to the amplifier 200. $P_e = G_s(P_{in}) P_{in}$ thus applies. It is then desired to obtain the ideal characteristic curve shown in FIG. 4B, namely $P_a = G_o P_{in}$. What, though, in reality applies according to the above equations is $P_a = G_v(G_s(P_{in}) P_{in}) G_s(P_{in}) P_{in}$. From this it is possible to derive the defining equation for pre-emphasizing Gs that is not the inverse of the real amplification $G_v(P_e)$: $G_v(G_s(P_{in}) P_{in}) G_s(P_{in}) = G_o$.

Figure 3:
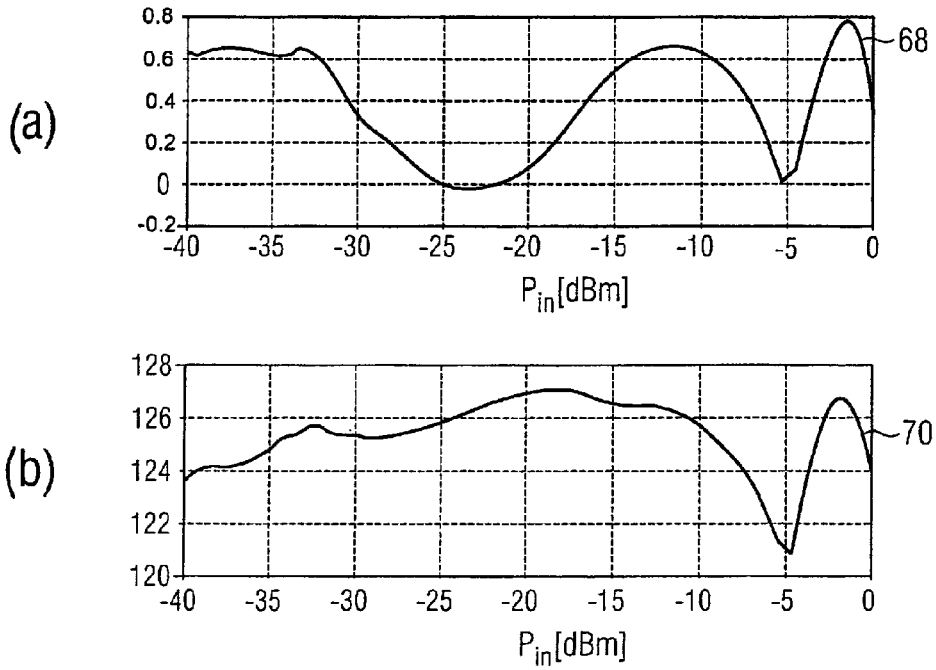
FIG. 3 shows the input-to-output transfer characteristics in the overall arrangement shown in FIG. 1, with the regulating circuit being inactive, for (a) magnitude and (b) phase.

Corresponding to graphs (a) and (b) in FIG. 6 for the RF amplifier 200 alone, graphs (a) and (b) shown in FIG. 3 are amplifier characteristics for the overall arrangement shown in FIG. 1 when the signals 34 and 36 are exactly zero, which is to say when the regulating circuit between the signal input 204 and signal output 210 is inactive, which is to say the entire transfer path of the RF input signal 206 to the RF output signal 212. The characteristic curve 68 again represents the magnitude and the characteristic curve 70 represents the phase of the transfer function. It can be seen, compared to graphs (a) and (b) in FIG. 6 that the variations in magnitude (curves 260, 68) have been reduced by means of the inventive pre-emphasizing according to FIG. 1 from 10 dB to around 0.8 dB. The phase variations (curves 262, 70) have been reduced from around 25° to around 6°. The result would for ideal pre-emphasizing be in each case horizontal ideal straight lines in graphs (a) and (b) in FIG. 3.

Although modifications and changes may be suggested by those skilled in the art, it is the intention of the inventor to embody within the patent warranted hereon all changes and modifications as reasonably and properly come within the scope of his contribution to the art.

I claim:

1. A control circuit for a radio-frequency (RF) amplifier, said RF amplifier having a power-dependent characteristic amplification curve, said control circuit comprising:
   an RF input supplied with an RF signal at RF frequency;
   an RF signal splitter;

a power meter;

a signal coupler connected to RF input that couples said RF signal to said RF signal splitter and to said power meter;

an IQ controller comprising an I path connected to an I factor input supplied with an I factor, and Q path connected to a Q factor input supplied with a Q factor;

said RF signal splitter splitting said RF signal coupled thereto into two RF signals that are respectively offset in phase by 90° relative to each other, a first of said two RF signals being supplied to said I path and a second of said two RF signals being supplied to said Q path;

said power meter detecting power of said RF signal coupled thereto, and emitting a low frequency (LF) signal at an output thereof representing the detected power, said LF signal having a frequency that is substantially below said RF frequency;

a first pre-emphasizer stage connected to said output of said power meter that applies an I factor correction curve, dependent on said power-dependent characteristic amplification curve, to said LF signal to generate an LF I factor correction value;

a second pre-emphasizer stage connected to said output of said power meter that applies a Q factor correction curve, dependent on said power-dependent characteristic amplification curve, to said LF signal to generate an LF Q factor correction value;

a first adder connected to said I factor input and to said first pre-emphasizer stage that adds said LF I factor correction value to said I factor, to produce an LF corrected I factor;

a second adder connected to said Q factor input and to said second pre-emphasizer stage that adds said LF Q factor correction value to said Q factor, to produce an LF corrected Q factor;

a first multiplier connected to said RF signal splitter and to said first adder that multiplies said first of said two RF signals by said LF corrected I factor, to produce a first multiplier output signal;

a second multiplier connected to said RF signal splitter and to said second adder that multiplies said second of said two RF signals by said LF corrected Q factor, to produce a second multiplier output; and a third adder connected to said first and second multipliers that add said first and second multiplier outputs to produce a third adder output that is supplied to said RF amplifier.

* * * * *